United States Patent
Tinsley et al.

(10) Patent No.: US 6,278,336 B1
(45) Date of Patent: Aug. 21, 2001

(54) LOW-CURRENT OSCILLATOR WITH HYSTERESIS INPUT BUFFER

(75) Inventors: Steven J. Tinsley, Garland; Fernando D. Carvajal, Fairview, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/258,170

(22) Filed: Feb. 25, 1999

Related U.S. Application Data

(60) Provisional application No. 60/076,123, filed on Feb. 27, 1998.

(51) Int. Cl.[7] .................................................. H03B 5/30
(52) U.S. Cl. ................. 331/74; 331/116 FE; 331/116 R; 331/158; 327/205
(58) Field of Search ............................... 331/116 FE, 74, 331/116 R, 182, 175, 158; 327/205

(56) References Cited

U.S. PATENT DOCUMENTS

| | | | |
|---|---|---|---|
| 3,753,154 | 8/1973 | Moreau et al. | 331/116 R |
| 3,911,378 | 10/1975 | Buchanan | 331/116 R |
| 3,979,698 | 9/1976 | Gollinger | 331/116 R |
| 4,095,195 | 6/1978 | Saito | 331/116 R |
| 4,218,661 | 8/1980 | Imamura | 331/116 FE |
| 4,328,571 | 5/1982 | Noble | 368/87 |
| 4,346,350 | 8/1982 | Morokawa et al. | 331/116 FE |
| 4,360,789 | 11/1982 | Lewyn et al. | 331/109 |
| 4,387,349 | 6/1983 | Rapp | 331/116 FE |
| 4,442,406 | 4/1984 | Voss | 328/134 |
| 4,591,807 | 5/1986 | Davis | 331/116 R |
| 4,613,829 | 9/1986 | Ott | 331/59 |
| 4,704,587 | 11/1987 | Ouyang et al. | 331/116 FE |
| 4,870,383 | 9/1989 | Nordholt | 331/116 R |
| 4,896,122 | 1/1990 | Tahemia et al. | 331/158 |
| 4,956,618 | 9/1990 | Ulmer | 331/116 FE |
| 5,162,757 | 11/1992 | Williams et al. | 331/78 |
| 5,194,831 | * 3/1993 | Jackson | 331/111 |
| 5,208,558 | 5/1993 | Shigehara et al. | 331/116 FE |
| 5,331,296 | 7/1994 | Davis | 331/158 |
| 5,450,042 | 9/1995 | Good et al. | 331/117 FE |
| 5,486,795 | 1/1996 | Spence et al. | 331/116 FE |
| 5,528,201 | 6/1996 | Davis | 331/116 FE |
| 5,546,055 | 8/1996 | Klughart | 331/116 FE |

\* cited by examiner

*Primary Examiner*—Arnold Kinkead
(74) *Attorney, Agent, or Firm*—April M. Mosby; W. James Brady; Frederick J. Telecky, Jr.

(57) ABSTRACT

A low-current oscillator with input buffer hysteresis for increased noise immunity during oscillator start-up. Resistors are switched in and out of the comparator input elements creating offsets in one leg of the comparator at a time.

24 Claims, 2 Drawing Sheets

LOW-CURRENT OSCILLATOR WITH HYSTERESIS INPUT BUFFER

This application claims priority under 35 USC §119(e)(1) of provisional application numbers 60/076,123 filed Feb. 27, 1998.

BACKGROUND AND SUMMARY OF THE INVENTION

This patent relates to crystal-stabilized integrated circuit oscillator circuits.

BACKGROUND
Crystal Oscillators

Crystal-controlled oscillators use the high Q of an electromechanical resonator (a quartz crystal) to stabilize an integrated oscillating circuit at a desired frequency. Such circuits can achieve a frequency stability in the parts-per-million range, and there is no other practical way to achieve such a constant frequency reference in an integrated circuit. Crystal-controlled oscillators are therefore extremely important, and likely to remain so.

Crystal-controlled oscillators pose some difficulties in design, and one of these is start-up. The impedance of the crystal is typically much higher at zero-current conditions (which are necessarily present at start-up), so in some implementations the initial loop gain is not enough to start the oscillator. A variety of start-up circuits have therefore been proposed; see e.g. B. Parzen, Design of Crystal and Other Harmonic Oscillators (1983), at page 415; Unkrich et al., "Conditions for Start-Up in Crystal Oscillators," 17 *IEEE J. Solid-State Circuits* 87 (1982).

Other difficulties are present in the specific context of low-power CMOS oscillator implementations. Many portable applications are designed for low operating voltage and low power consumption, but also require the frequency stability of a crystal oscillator. To reduce power consumption, such low-power CMOS oscillator circuits are typically operated in the weak inversion regime (where gate voltages are only slightly greater than the threshold voltage). However, in the weak inversion regime the gain tends to be lower, and thus start-up is a particularly critical problem. See e.g. U.S. Pat. No. 5,546,055, which is hereby incorporated by reference.

Low-Current Oscillator With Input Buffer Hysteresis

The present application discloses an oscillator circuit which includes hysteresis in the differential input comparator to delay the production of clock pulses until a certain peak-to-peak voltage level is detected on the oscillator pins. The hysteresis component buffers the signal from noise presented at the oscillator pins. The hysteresis buffer design incorporates the same basic functional architecture of a differential comparator, but uses switched resistors in the differential inputs to create voltage offset. Hysteresis is created by switching-in the resistors on opposite phases of the clock to create offset in one comparator input at a time.

An advantage of the disclosed methods and structure is that noise immunity is significantly improved. Another advantage is that the hysteresis circuit is initiated during oscillator start-up, and not later as in prior-art designs. Another advantage is that the circuit offers an additional level of design control during start-up.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Pierce Oscillator With Hysteretic Comparator

Figure 1:
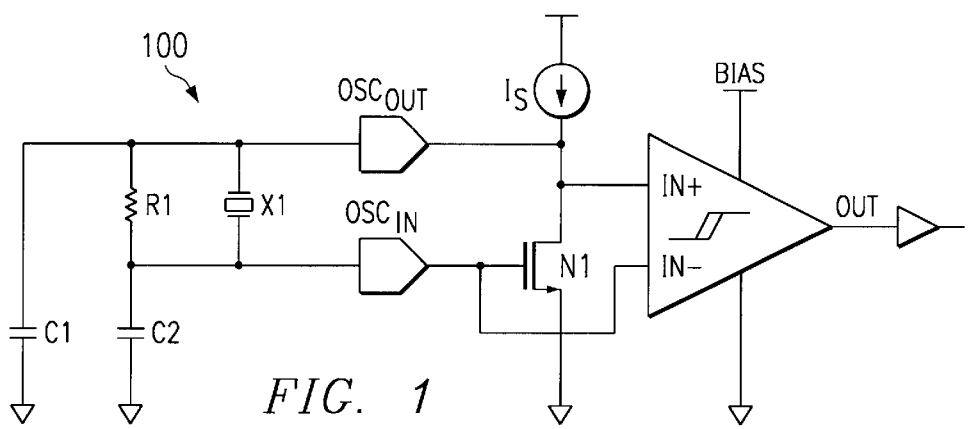
FIG. 1 shows a preferred embodiment using a Pierce oscillator coupled to a hysteretic differential circuit.

In the system shown in FIG. 1, the $Osc_{in}$ and $Osc_{out}$ pins connect to the input terminals of a hysteretic comparator 100. In a prior-art configuration, where the comparator circuit does not incorporate the delayed start-up circuit, false signals may be present at the output of the circuit. Preferably the comparator circuit comprises the innovative hysteresis circuit to delay output of the oscillating signal until the oscillating signal reaches a desired peak-to-peak level.

Prior-Art Pierce Oscillator

Figure 2:
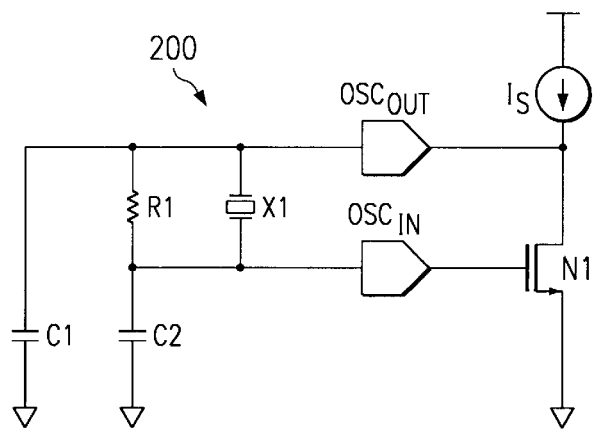
FIG. 2 shows a prior-art Pierce oscillator circuit.

Previous Pierce oscillator designs incorporated a single-ended buffer, or a differential buffer without hysteresis. Signal filtering on start-up was accomplished using a counter to delay the production of clock signals for a predetermined number of clock cycles, in order to provide enough time for the oscillator to achieve adequate voltage levels before producing clocks. The basic Pierce oscillator circuit is illustrated in FIG. 2. The Pierce oscillator 200 consists of an inverting amplifier, in this case a constant-current (current source Is) NMOS inverter N1, which is biased in the linear region by a feedback resistor R1. Phase shift is provided by a tank circuit (capacitors C1 and C2). The oscillation frequency is set by a resonant element X1, which in modern circuits is typically a quartz crystal or piezoelectric ceramic resonator (e.g. 4.2 MHz crystal oscillator, or a 20 MHz ceramic resonator). The transconductance of N1 provides gain for the oscillator 200, and 360 degrees are provided around the loop of N1 (180 degrees), C1 (90 degrees), and C2 (90 degrees). Typical circuit device values may be, for example, Is=200 micro-amps, C1=10 pF, C2=10 pF, and R1=1 meg-ohm. The process is a 0.72 micron PRISM base process (CMOS). The device size for transistor N1 may, for example, be 60/1 (in microns W/L).

In the case of low power oscillators, the bias current necessary to run transistor N1 is minimized, and the oscillator 200 operates close to the minimum energy necessary to maintain oscillations in the resonant component X1. In such applications, it is necessary to minimize the load on the resonant terminals ($Osc_{in}$ and $Osc_{out}$). One approach to this problem has been to connect the $Osc_{in}$ and $Osc_{out}$ terminals to the inputs of a differential comparator, such that during oscillation, when $Osc_{in}$ and $Osc_{out}$ cross each other, the output of the comparator toggles. In this way, no DC load is presented to $Osc_{in}$ or $Osc_{out}$, and the capacitive load from the comparator gates can be very small. One of the concerns of such a configuration is noise immunity. In applications where the oscillator is being used to drive a clock circuit, such as a microprocessor clock, false clocks are highly undesirable.

Hysteretic Comparator Circuit

Figure 3:
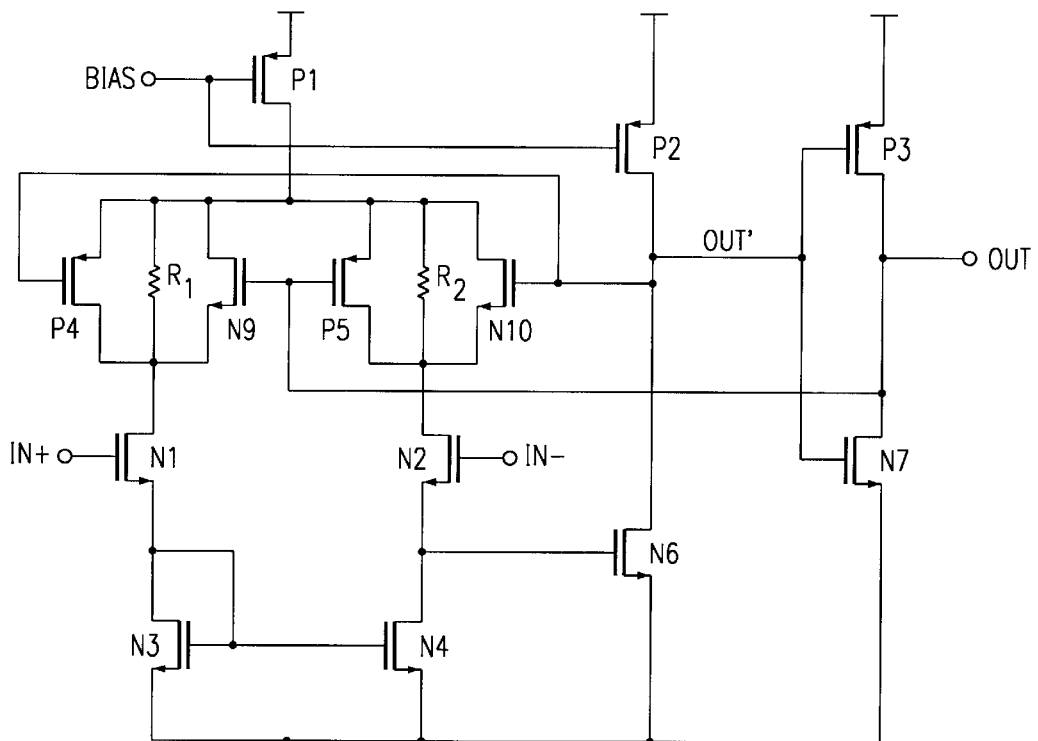
FIG. 3 shows a preferred embodiment of the differential comparator circuit with hysteresis.

The preferred embodiment of the invention utilizes a differential comparator with hysteresis to buffer the input signal from noise on the oscillator pins. The hysteresis comparator, in the presently preferred embodiment, is illustrated in FIG. 3. The hysteresis buffer design incorporates the same basic functional architecture of the differential comparator (FIG. 5), but uses switched resistors in the differential input tails to create voltage offset. Transistors pairs P4/N9 and P5/N10 act as transmission gates to switch resistors R1 and R2 in and out of the circuit. This creates an offset in the switching voltages of transistors N1 and N2. The transmission gates are controlled by the output OUT and its complement OUT'. Hysteresis is created by switching in the resistors R1 and R2 on opposite phases of the clock to create offset in one comparator leg at a time. When the voltage at terminal In+ is much greater than the voltage at terminal In−, the gate of transistor N6 is high, and N6 is conducting current. The gates of transistors P4 and N10 are low. The output OUT is high, and the gates of transistors N9 and P5 are high. Transistors N9 and P4 are on, creating a direct current path between the drain of N1 and the bias provided by P1. Transistors P5 and N10 are off, creating a circuit path from P1 through resistor R2 to the drain of N2. This creates a voltage drop across R2, which makes the drain of N2 lower in voltage than the drain of N1.

As the voltage at terminal In+ decreases, and the voltage at terminal In− increases, the voltage at terminal In+ eventually drops below that of terminal In−. However, the voltage at terminal In− must overcome the voltage drop across resistor R2 ($V_{R2}$) before switching takes place.

When the voltage at terminal In+ is less than the voltage difference of terminal In− and $V_{R2}$, transistor N1 turns off. Transistor N6 turns off since its gate voltage is now low. The gates of P4 and N10 are high. The output OUT is low, and the gates of N9 and P5 are low. Transistors N9 and P4 are off, creating a current path through R1 to the drain of N1. Transistors P5 and N10 are off, creating a direct current path from the drain of N2 to the bias current from P1.

As the voltage at terminal In+ begins to rise, and the voltage at terminal In− falls, and eventually In+ rises above In−. However, in this case, the voltage at terminal In+ must overcome the voltage drop across resistor R1 ($V_{R1}$) before switching takes place.

The device sizes (in microns W/L) of FIG. 1 are based on a 0.72 micron PRISM base process (CMOS), and can be, for example, the following: N1-40/2, N2-40/2, N3-10/2, N4-10/2, N6-10/2, N7-2/1, N9-20/1, N10-20/1, P1-16/2, P2-8/2, P3-5/1, P4-20/1, P5-20/1; resistor values are R1=8K ohms, and R2=8K ohms.

Prior-Art Input Buffer

Figure 5:
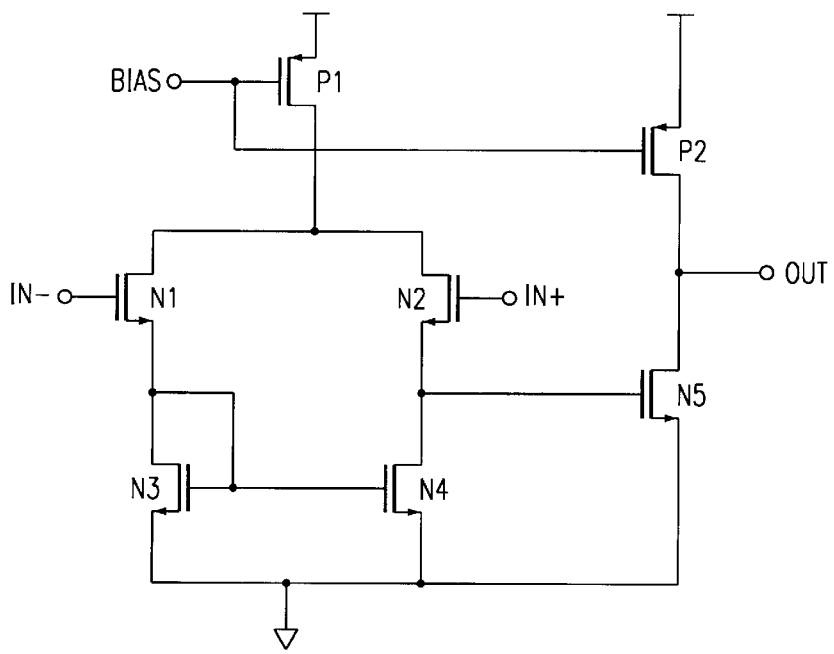
FIG. 5 shows a prior-art input buffer design.

FIG. 5 shows a prior-art input buffer design. The input buffer is a simple CMOS differential comparator circuit. Transistors N1 and N2 act as a differential NMOS input pair, biased by the voltage through PMOS transistor P1. Transistors N3 and N4 form a current mirror load, and N5 (biased by transistor P2) forms the output device. When the voltage at input In− is greater than the voltage at complementary input In+, the output OUT is pulled to a logic low. When the voltage at In+ is greater than the voltage at In−, output OUT is pulled to a logic high.

Oscillator Start-Up Waveform

Figure 4:
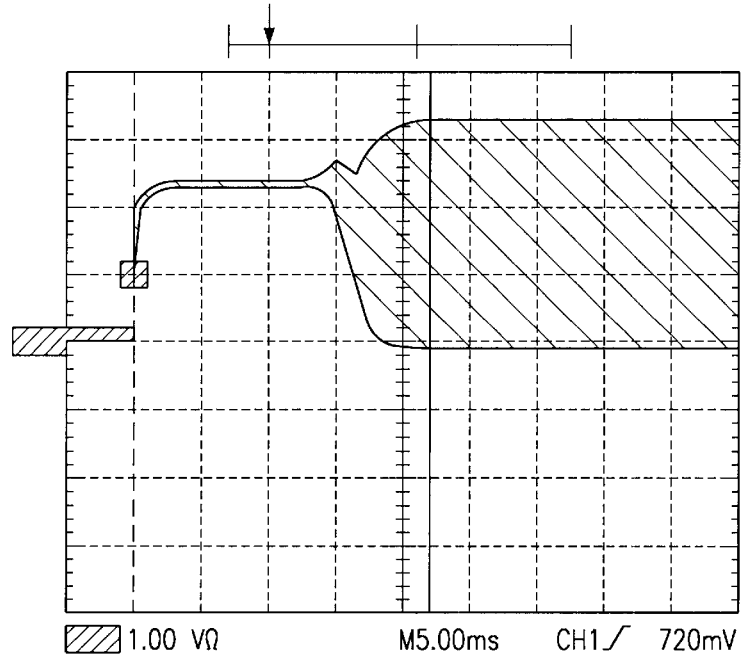
FIG. 4 shows a prior-art oscillator start-up waveform.

During start-up, there is a significant period between the time VCC is asserted and the resonator pins attain full scale oscillation. FIG. 4 shows a waveform, in this example, a resonator frequency of 4 MHz. The plot shows a 15 ms period between the time the bias is asserted, and the time that oscillations begin to build. At 4 MHz, the start-up time period equates to approximately 60,000 clock cycles. During this time, the oscillator pins are highly susceptible to noise. If noise creates a small differential voltage between $Osc_{in}$, and $Osc_{out}$, the comparator could toggle, causing false clocks, or destructive runt clocks.

According to a disclosed class of innovative embodiments, there is provided: an oscillator circuit, comprising: an oscillator subcircuit, which provides an oscillating signal; and a hysteretic comparator circuit with an input for receiving said oscillating signal, and at least an output for providing an output signal; whereby said comparator circuit delays output of said output signals until said oscillating signal reaches a certain peak-to-peak voltage level.

According to another disclosed class of innovative embodiments, there is provided: a low-current oscillator with input buffer hysteresis, comprising: a oscillator subcircuit which generates an oscillating signal; and a hysteretic comparator circuit, comprising: first and second input elements connected to receive said oscillating signal at control terminals thereof; a current-comparison network, connected to provide an output signal which corresponds to a linear combination of currents passed by said input elements; a bias-current circuit which is operatively connected to provide a bias current to said first and second input elements jointly; first and second series resistors, each interposed between said bias-current circuit and a respective one of said input elements; and resistor-switching subcircuits operatively connected to bypass one or the other of said resistors, in a hysteretic dependence on the output of said current-comparison network; whereby noise immunity is enhanced during start-up by delaying the output of signals at an output of said comparator circuit until said oscillating signal reaches a certain voltage level.

According to another disclosed class of innovative embodiments, there is provided: a method for preventing unwanted signals at the output of an oscillator circuit during start-up, comprising the steps of: (a.) starting an oscillator circuit to provide an oscillating signal; and (b.) buffering said oscillating signal with a hysteretic comparator circuit; wherein the hysteretic characteristics of said comparator delay the output of signals from an output of said comparator circuit until said oscillating signal reaches a certain peak-to-peak voltage level.

According to another disclosed class of innovative embodiments, there is provided: a method for improving noise immunity in an oscillation circuit, comprising the steps of: (a.) starting an oscillator circuit to provide an oscillating signal; and (b.) buffering said oscillating signal with a hysteretic comparator by (i.) receiving said oscillating signal at control terminals of first and second input elements; (ii.) providing a current-comparison network connected to furnish an output signal which corresponds to a linear combination of currents passed by said input elements; (iii.) providing a bias current with a bias-current circuit to said first and second input elements jointly, through first and second series resistors which are interposed between said bias-current circuit and said first and second input elements, respectively; and (iv.) bypassing one or the other of said resistors, in a hysteretic dependence on the output of said current-comparison network; whereby noise immunity is enhanced during start-up by delaying the output of signals at an output of said comparator circuit until said oscillating signal reaches a certain voltage level.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

It should be noted that the disclosed innovative ideas also apply to other conventional oscillator topologies, such as for example, Colpitts or Hartley oscillators.

Similarly, it will be readily recognized that the described process steps can also be embedded into hybrid process flows, such as BiCMOS or smart-power processes.

It should also be noted that the switched resistor circuits may be implemented with circuits other than transmission gates, such as cascoded gates.

It should also be noted that the innovative start-up method may be applied to oscillator topologies using oscillators other than crystal or ceramic resonators, for example, LC oscillators.

What is claimed is:

1. An oscillator circuit, comprising:
   an oscillator subcircuit, which provides an oscillating signal; and
   a hysteretic comparator circuit with an input for receiving said oscillating signal, and at least an output for providing at least one output signal;
   wherein said comparator circuit delays output of said at least one output signal until said oscillating signal reaches a certain peak-to-peak voltage level and said hysteretic comparator circuit comprises switched resistor circuits which are switched on opposing clock cycles.

2. An oscillator circuit, comprising:
   an oscillator subcircuit, which provides an oscillating signal; and
   a hysteretic comparator circuit with one input element of a plurality of input elements for receiving said oscillating signal, and at least an output for providing at least one output signal;
   wherein said comparator circuit delays output of said at least one output signal until said oscillating signal reaches a certain peak-to-peak voltage level and said hysteretic comparator circuit comprises switched resistor circuits which selectively connect resistors to respective said plurality of input elements of said hysteretic comparator circuit to provide a voltage offset.

3. An oscillator circuit, comprising:
   an oscillator subcircuit, which provides an oscillating signal; and
   a hysteretic comparator circuit with one input element of a plurality of input elements for receiving said oscillating signal, and at least an output for providing at least one output signal;
   wherein said comparator circuit delays output of said at least one output signal until said oscillating signal reaches a certain peak-to-peak voltage level and said output is part of an inverter circuit which controls switched resistor circuits connected to said plurality of input elements of said hysteretic comparator circuit.

4. An oscillator circuit, comprising:
   an oscillator subcircuit, which provides an oscillating signal; and
   a hysteretic comparator circuit with an input for receiving said oscillating signal, and at least an output for providing at least one output signal;
   wherein said comparator circuit delays output of said at least one output signal until said oscillating signal reaches a certain peak-to-peak voltage level and said oscillator is crystal-controlled and an offset is created in one comparator input at a time.

5. The circuit of claim 1, wherein said oscillating signal is differential.

6. A low-current oscillator with input buffer hysteresis, comprising:
   an oscillator subcircuit which generates an oscillating signal; and
   a hysteretic comparator circuit, comprising:
     first and second input elements connected to receive said oscillating signal at control terminals thereof;
     a current-comparison network, connected to provide at least one output signal which corresponds to a linear combination of currents passed by said input elements;
     a bias-current circuit which is operatively connected to provide a bias current to said first and second input elements jointly;
     first and second series resistors, each interposed between said bias-current circuit and a respective one of said input elements; and
     resistor-switching subcircuits operatively connected to bypass one or the other of said resistors, in a hysteretic dependence on the output of said current-comparison network;
   wherein noise immunity is enhanced during start-up by delaying the at least one output signal at an output of said comparator circuit until said oscillating signal reaches a certain voltage level.

7. The circuit of claim 6, wherein said resistor-switching subcircuits are switched on opposing clock phases.

8. The low current oscillator of claim 6, wherein a voltage at either of said first and second input elements must exceed the voltage drop across said series resistor circuit of the opposing input element before switching occurs.

9. The low current oscillator of claim 6, wherein said comparator circuit further comprises an output inverter circuit with complementary outputs for driving said resistor-switching subcircuits.

10. The low current oscillator of claim 6, wherein said resistor-switching subcircuits comprise transmission gates which are operated by an output inverter circuit.

11. The low current oscillator of claim 6, wherein said oscillator is crystal-controlled.

12. The low current oscillator of claim 6, wherein said oscillating signal is differential.

13. A method for preventing unwanted signals at the output of an oscillator circuit during start-up, comprising the steps of:
   a. starting an oscillator circuit to provide an oscillating signal; and
   b. buffering said oscillating signal with a hysteretic comparator circuit to provide at least one output signal;
   wherein the hysteretic characteristics of said comparator delay the output of the at least one output signal from an output of said comparator circuit until said oscillating signal reaches a certain peak-to-peak voltage level and said comparator circuit comprises switched resistor circuits which are switched on opposing clock cycles.

14. A method for preventing unwanted signals at the output of an oscillator circuit during start-up, comprising the steps of:

a. starting an oscillator circuit to provide an oscillating signal; and b. buffering said oscillating signal with a hysteretic comparator circuit to provide at least one output signal;

wherein the hysteretic characteristics of said comparator delay the output of the at least one output signal from an output of said comparator circuit until said oscillating signal reaches a certain peak-to-peak voltage level and said hysteretic comparator circuit comprises switched resistor circuits which selectively connect resistors to respective input elements of said comparator circuit to provide a voltage offset.

15. A method for preventing unwanted signals at the output of an oscillator circuit during start-up, comprising the steps of:

a. starting an oscillator circuit to provide an oscillating signal; and b. buffering said oscillating signal with a hysteretic comparator circuit to provide at least one output signal;

wherein the hysteretic characteristics of said comparator delay the output of the at least one output signal from an output of said comparator circuit until said oscillating signal reaches a certain peak-to-peak voltage level and said output is part of an inverter circuit which controls switched resistor circuits connected to input elements.

16. A method for preventing unwanted signals at the output of an oscillator circuit during start-up, comprising the steps of:

a. starting an oscillator circuit to provide an oscillating signal; and b. buffering said oscillating signal with a hysteretic comparator circuit to provide at least one output signal;

wherein the hysteretic characteristics of said comparator delay the output of the at least one output signal from an output of said comparator circuit until said oscillating signal reaches a certain peak-to-peak voltage level and said oscillator is crystal-controlled and an offset is created in one comparator input at a time.

17. The method of claim 13, wherein said oscillating signal is differential.

18. A method for improving noise immunity in an oscillation circuit, comprising the steps of:

(a.) starting an oscillator circuit to provide an oscillating signal; and (b.) buffering said oscillating signal with a hysteretic comparator by (i.) receiving said oscillating signal at control terminals of first and second input elements;

(ii.) providing a current-comparison network connected to furnish an output signal which corresponds to a linear combination of currents passed by said input elements;

(iii.) providing a bias current with a bias-current circuit to said first and second input elements jointly, through first and second series resistors which are interposed between said bias-current circuit and said first and second input elements, respectively; and (iv.) bypassing one or the other of said series resistors, in a hysteretic dependence on the output of said current-comparison network by way of resistor-switching subcircuits;

whereby noise immunity is enhanced during start-up by delaying the output of signals at an output of said hysteretic comparator circuit until said oscillating signal reaches a certain voltage level.

19. The method of claim 18, wherein said resistor-switching subcircuits are switched on opposing clock phases.

20. The method of claim 18, wherein a voltage at either of said first and second input elements must exceed the voltage drop across said series resistor circuit of the opposing input element before switching occurs.

21. The method of claim 18, wherein said hysteretic comparator circuit further comprises an output inverter circuit with complementary outputs for driving said resistor-switching subcircuits.

22. The method of claim 18, wherein said resistor-switching subcircuits resistor circuits comprise transmission gates which are operated by an output inverter circuit.

23. The method of claim 18, wherein said oscillator is crystal-controlled.

24. The method of claim 18, wherein said oscillating signal is differential.

* * * * *